(12) United States Patent
Cho

(10) Patent No.: US 10,977,109 B2
(45) Date of Patent: Apr. 13, 2021

(54) APPARATUS INCLUDING SAFETY LOGIC

(71) Applicant: SAMSUNG ELECTRONICS CO., LTD., Suwon-si (KR)

(72) Inventor: Dong-Sik Cho, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/704,045

(22) Filed: Dec. 5, 2019

(65) Prior Publication Data

US 2020/0167223 A1 May 28, 2020

Related U.S. Application Data

(63) Continuation-in-part of application No. 16/533,420, filed on Aug. 6, 2019.

(30) Foreign Application Priority Data

| Aug. 7, 2018 | (KR) | 10-2018-0092061 |
| Feb. 20, 2019 | (KR) | 10-2019-0020050 |
| Sep. 25, 2019 | (KR) | 10-2019-0118379 |

(51) Int. Cl.
| G06F 11/07 | (2006.01) |
| H03K 19/21 | (2006.01) |
| G01R 31/3177 | (2006.01) |

(52) U.S. Cl.
CPC ...... *G06F 11/0772* (2013.01); *G01R 31/3177* (2013.01); *G06F 11/0736* (2013.01); *G06F 11/0751* (2013.01); *H03K 19/21* (2013.01)

(58) Field of Classification Search
CPC .................................................. G06F 11/10772

USPC ........................................................ 714/819
See application file for complete search history.

(56) References Cited

U.S. PATENT DOCUMENTS

| 6,789,030 | B1* | 9/2004 | Coyle ................ G01D 9/005 |
| | | | 702/182 |
| 7,188,284 | B2 | 3/2007 | Mitra et al. |
| 8,516,356 | B2 | 8/2013 | Brewerton et al. |
| 9,583,218 | B1 | 2/2017 | Hutton et al. |
| 9,710,318 | B2 | 7/2017 | Xiao et al. |
| 9,964,597 | B2 | 5/2018 | Rangachari et al. |
| 10,754,334 | B2* | 8/2020 | Cella ..................... H04L 67/12 |
| 2016/0292059 | A1 | 10/2016 | Catherwood et al. |
| 2018/0060163 | A1 | 3/2018 | Jalan et al. |
| 2018/0284735 | A1* | 10/2018 | Cella ............... G05B 19/41865 |

FOREIGN PATENT DOCUMENTS

JP          4443545 A          2/2007

* cited by examiner

*Primary Examiner* — Fritz Alphonse
(74) *Attorney, Agent, or Firm* — Volentine, Whitt & Francos, PLLC

(57) ABSTRACT

An apparatus includes a first function module providing a master signal, a second function module providing a comparison signal, and safety logic. The safety logic includes a toggle signal generator having a comparator providing a comparison result in response to the master signal and the comparison signal, a feedback path generating a first toggle signal in response to the comparison result and providing a feedback signal to the comparator, and a first multiple input gate generating a second toggle signal in response to the comparison result. The safety logic also includes a toggle signal monitor providing a final fault search signal in response to the first toggle signal and the second toggle signal.

12 Claims, 15 Drawing Sheets

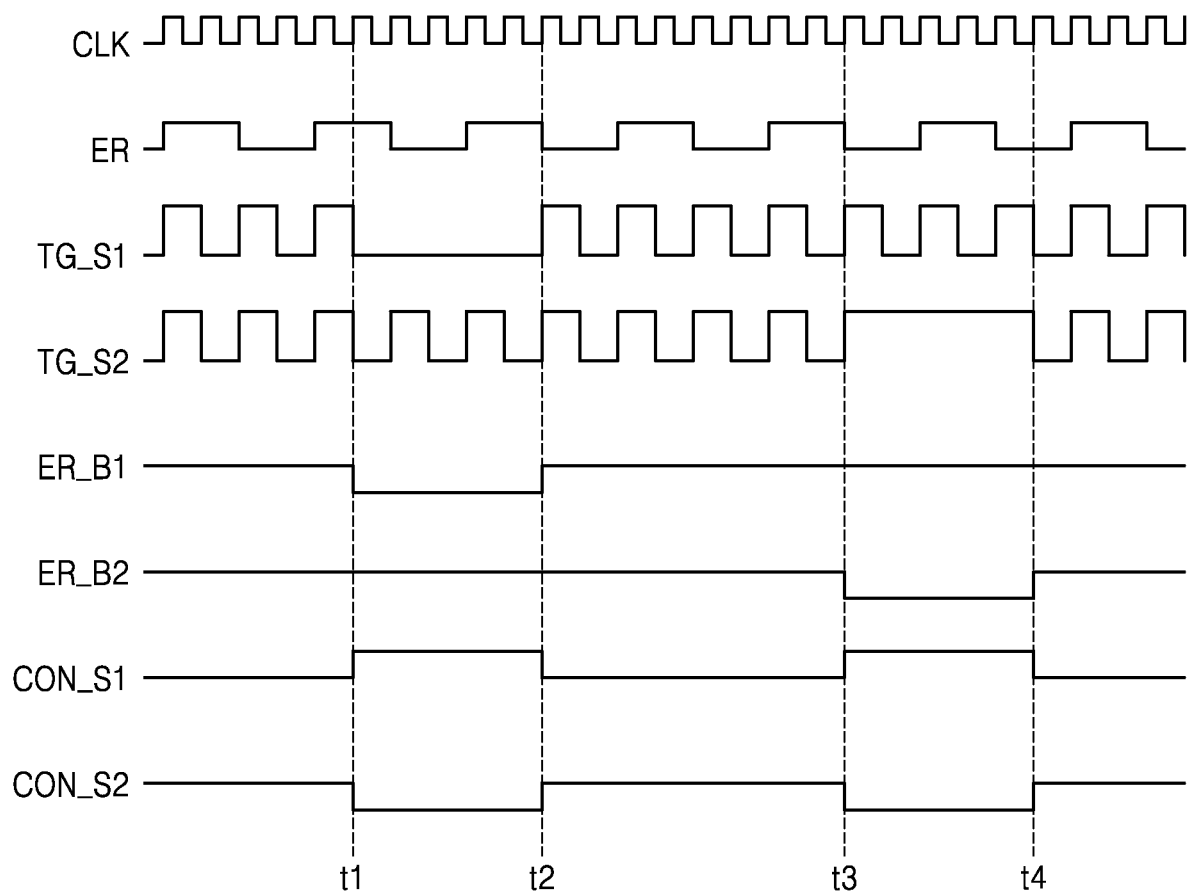

FIG. 8B

| ER | XOR (112-1~112-N) | | AND(122) | | OR(130) | | Fault location<br>NOT(126) | | XOR(210) | | XOR(230) | | NAND(250) | | NOR(260) | | |
|---|---|---|---|---|---|---|---|---|---|---|---|---|---|---|---|---|---|
| | CON_S1 | CON_S2 | CON_S1 | CON_S2 | CON_S1 | CON_S2 | CON_S1 | CON_S2 | CON_S1 | CON_S2 | CON_S1 | CON_S2 | CON_S1 | CON_S2 | CON_S1 | CON_S2 | |
| 0 | 1 | 0 | 1 | 0 | 1 | 0 | 1 | 1 | 1 | 0 | 1 | 0 | 0 | 0 | 0 | 0 | CASE 1 |
| 1 | 0 | 0 | 0 | 0 | 0 | 0 | 0 | 1 | 1 | 1 | 1 | 1 | 0 | 1 | 1 | 0 | |
| 0 | 1 | 0 | 1 | 0 | 1 | 0 | 1 | 0 | 0 | 0 | 1 | 0 | 0 | 1 | 0 | 1 | CASE 2 |
| 1 | 0 | 0 | 0 | 0 | 0 | 0 | 0 | 0 | 1 | 0 | 0 | 1 | 1 | 1 | 1 | 1 | |

TB2

APPARATUS INCLUDING SAFETY LOGIC

CROSS-REFERENCE TO RELATED APPLICATIONS

This is a Continuation-In-Part of U.S. patent application Ser. No. 16/533,420, filed Aug. 6, 2019, and a claim of priority is made to Korean Patent Application Nos. 10-2018-0092061, 10-2019-0020050 and 10-2019-0118379, respectively filed on Aug. 7, 2018, Feb. 20, 2019 and Sep. 25, 2019 in the Korean Intellectual Property Office, the collective subject matter of which is hereby incorporated by reference.

BACKGROUND

The inventive concept relates to apparatuses including safety logic. More particularly, the inventive concept relates to various apparatuses including safety logic configured to determine whether a master signal correctly correlates with a comparison signal during a run-time.

In the broad context of electrical, mechanical and electromechanical apparatuses, such as automobiles, a latent fault is a particular type of fault—the occurrence of which goes undetected by a safety mechanism intended to perform such detection during a fault detection interval. Latent faults also remain undetected by a user of the apparatus. Hence, a latent fault may be understood as a silent fault that may evolve (or migrate) into multiple faults leading eventually to serious performance failures in the apparatus. One typical example of a latent fault is a memory bit fault.

Faults and potential faults should be checked during a latent-fault tolerant time interval (L-FTTI) to prevent the occurrence of the latent fault. For example, a memory bit fault should be checked for each memory access. Conventional fault checking methods relying on built-in self-test (BIST) logic and/or software test libraries (STL) usually suspend normal operation (e.g., memory access operation(s)) in order to check for fault(s). Such temporary suspension of operations may exceed the L-FTTI, and generally increases hardware and/or software overhead associated with fault checking.

SUMMARY

Embodiments of the inventive concept provide apparatuses including safety logic capable of detecting potentially latent faults.

According to an aspect of the inventive concept, there is provided an apparatus including; a first function module configured to provide a master signal; a second function module configured to provide a comparison signal; and safety logic including; a toggle signal generator including at least one comparator configured to provide a comparison result in response to the master signal and the comparison signal, a feedback path configured to generate a first toggle signal in response to the comparison result and provide a feedback signal to the at least one comparator, and a first multiple input gate configured to generate a second toggle signal in response to the comparison result; and a toggle signal monitor configured to provide a final fault search signal in response to the first toggle signal and the second toggle signal, and wherein the toggle signal monitor includes; a first XOR gate configured to provide a first error occurrence signal in response to the first toggle signal; a second XOR gate configured to provide a second error occurrence signal in response to the second toggle signal; a first output gate configured to provide a first fault search signal in response to the first and second error occurrence signals; a second output gate configured to provide a second fault search signal in response to the first and second error occurrence signals; a second delay circuit configured to delay the first toggle signal and provide a delayed first toggle signal to the first XOR gate; and a third delay circuit configured to delay the second toggle signal and provide a delayed second toggle signal to the second XOR gate.

According to another aspect of the inventive concept, there is provided an apparatus including safety logic, the safety logic including; a toggle signal generator configured to provide a first toggle signal and a second toggle signal in response to a master signal and a comparison signal, wherein each of the master signal and comparison signal includes a plurality of bits; a toggle signal monitor configured to provide a final fault search signal in response to monitoring of the first toggle signal and the second toggle signals; and wherein the toggle signal generator includes; a plurality of comparators configured to bit-for-bit compare the master signal with the comparison signal and generate a comparison result; a feedback path configured to perform a first gate operation in response to the comparison result, generate the first toggle signal, and provide a feedback signal to each of the plurality of comparators in response to the first toggle signal; and a first multiple input gate configured to perform a second gate operation in response to the comparison result and generate the second toggle signal; and a clock generator configured to provide a clock signal, wherein the feedback path provides the feedback signal further in response to the clock signal; and wherein the toggle signal monitor includes; a first XOR gate configured to provide a first error occurrence signal in response to the first toggle signal; a second delay circuit configured to delay the first toggle signal in response to the clock signal and provide a delayed first toggle signal to the first XOR gate; a second XOR gate configured to provide a second error occurrence signal in response to the second toggle signal; a third delay circuit configured to delay the second toggle signal in response to the clock signal and provide a delayed second toggle signal to the second XOR gate; and a plurality of output gates configured to provide the final fault search signal in response to the first error occurrence signal and the second error occurrence signal.

According to another aspect of the inventive concept, there is provided a method of operating an apparatus including safety logic, the method including: determining whether a master signal correctly correlates with a comparison signal and generating a first toggle signal and a second toggle signal in response to the determination of whether or not the master signal correctly correlates with the comparison signal; and generating a final fault search signal in response to the first toggle signal and the second toggle signal, wherein the final fault search signal provides information indicating whether or not the master signal correctly correlates with the comparison signal, and further provides information indicating whether or not at least one of the logic gates used in the determining of whether or not the master signal correctly correlates with the comparison signal is faulty.

BRIEF DESCRIPTION OF THE DRAWINGS

Embodiments of the inventive concept will be more clearly understood from the following detailed description taken in conjunction with the accompanying drawings in which:

FIG. 7 is a timing diagram illustrating exemplary signal timing relationships according to embodiments of the inventive concept;

FIGS. 8A and 8B are respective tables illustrating values for a final fault search signal provided under various conditions;

DETAILED DESCRIPTION

Hereinafter, certain embodiments of the inventive concept will be described in some additional detail with reference to the accompanying drawings.

Figure 1:
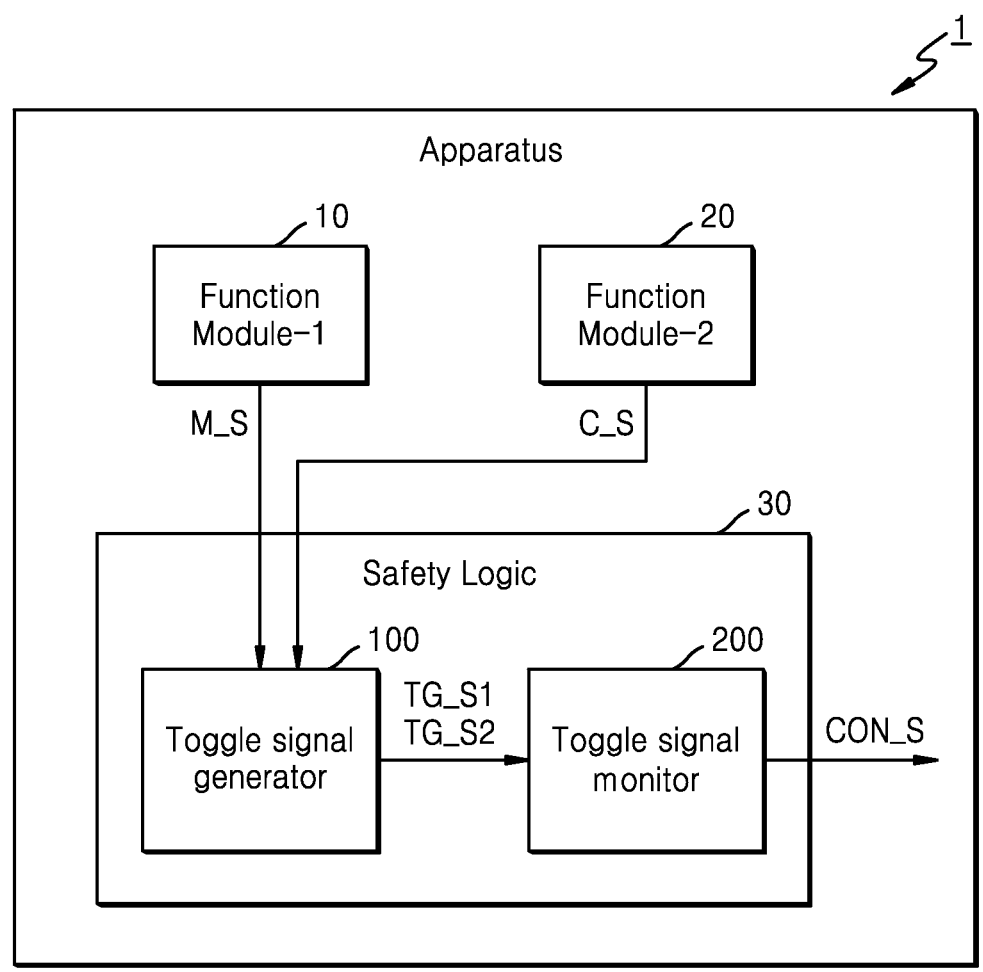
FIG. 1 is a block diagram illustrating an apparatus according to embodiments of the inventive concept.

FIG. 1 is a block diagram of an apparatus 1 according to an embodiment of the inventive concept.

Referring to FIG. 1, the apparatus 1 generally comprises a first function module 10, a second function module 20 and safety logic 30. The apparatus 1 may be designed to perform one or more functions. The operation of the apparatus 1 may be controlled in response to various electric signals. For example, the apparatus 1 may be applied to a robot device (e.g., a drone and an advanced drivers assistance system (ADAS)), an autonomous vehicle, a smart TV, a smartphone, a medical device, a mobile device, an image display device, a measuring device, and an Internet of Things (IoT) device. In addition, the apparatus 1 may be mounted on at least one of various types of electronic devices.

The first function module 10 is configured to perform at least one function associated with the operation of the apparatus 1. As one example, the first function module 10 may execute (or perform) a predetermined function in order to generate (or define) a master signal M_S. This master signal M_S may then be used to control one or more operations of the apparatus 1. As another example, the first function module 10 may generate a sensing value (or a sensing signal) associated with a condition (e.g., a power condition) or temperature associated with the apparatus 1. This sensing signal may be provided as the master signal M_S. (Hereafter, a sensing signal may be understood as being related to a "condition", such as temperature or power).

In contrast to the first function module 10 which provides (e.g., outputs) a master (or primary) signal, the second function module 20 provides a comparison signal C_S to be compared with the master signal M_S. Hence, the second function module 20 may be understood as providing a secondary (or comparative) signal relative to the master signal provided by the first function module 10. In some embodiments, the second function module 20 may be the functional mirror of the first function module. That is, the second function module may have the same constituent configuration as the first function module 10. In this manner, assuming that there is no fault associated with the operation of either the first function module 10 or second function module 20, the comparison signal C_S should correctly correlate with the master signal M_S. In some embodiments the phrase "correctly correlates with" means that the master signal M_S "is equal to" the comparison signal C_S. However, in other embodiments the phrase "correctly correlates with" means that the master signal M_S fails within an established range, limit or tolerance relationship with respect to the comparison signal C_S. In other words, the first and second function modules 10 and 20 may be designed in a mirrored (or lockstep) manner in order to detect faults potentially occurring in the master signal M_S as provided by the first function module 10.

In other embodiments where the first function module 10 provides a sensing signal associated with a condition as the master signal M_S, the second function module 20 may provide a critical sensing value to be compared with the sensing value as the comparison signal C_S. For example, when the first function module 10 is a temperature sensor, the first function module 10 may provide a temperature sensing signal as the master signal M_S, and the second function module 20 may provide a critical temperature value as the comparison signal C_S.

As illustrated in FIG. 1, the safety logic 30 may include a toggle signal generator 100 and a toggle signal monitor 200. In an example embodiment, the toggle signal generator 100 may receive the master signal M_S and the comparison signal C_S and generate a first toggle signal TG_S1 and a second toggle signal TG_S2 in response to the master signal M_S and the comparison signal C_S. In certain embodiments, each toggle signal may be a signal in which logical high and logical low levels are repeated in a predetermined cycle.

The toggle signal generator 100 may provide the first and second toggle signals TG_S1 and TG_S2 to the toggle signal monitor 200. In an example embodiment, the toggle signal generator 100 may include at least one comparator configured to generate a "comparison result" in response to a comparison of the master signal M_S with the comparison signal C_S. The toggle signal generator 100 may also include a feedback path configured to generate the first toggle signal TG_S1 in response to the comparison result, and provide a feedback signal to the at least one comparator. The toggle signal generator 100 may also include a first multiple input gate configured to generate the second toggle signal TG_S2 in response to the comparison result. For example, the master signal M_S, as well as the comparison signal C_S, may include a plurality of bits (e.g., respectively, a first plurality of bits and a second plurality of bits, where the first and second plurality of bits may be the same or different), and the toggle signal generator 100 may include a plurality of comparators having a desired number such that respective (or analogous) bits of the master signal M_S and the comparison signal C_S may be compared. That is, the toggle signal generator 100 may perform an operation wherein the master signal M_S and the comparison signal C_S are compared on a "bit-for-bit basis" to determine whether the master signal M_S correctly correlates with the comparison signal C_S.

In this manner, the toggle signal generator 100 may communicate information indicating whether or not the master signal M_S correctly correlates with the comparison signal C_S to the toggle signal monitor 200 using the first and second toggle signals TG_S1 and TG_S2. For example, when the master signal M_S correctly correlates with the comparison signal C_S, each of the first and second toggle signals TG_S1 and TG_S2 may be a "normal" toggle signal (i.e., a high/low toggling signal having a predetermined cycle). However, when at least one bit of the master signal M_S is different from an analogous bit of the comparison signal C_S, at least one of the first and second toggle signals TG_S1 and TG_S2 may be an "abnormal" toggle signal (i.e., a signal different from a normal toggle signal). For example, when at least one bit of the master signal M_S is different from that of the comparison signal C_S, at least one of the first and second toggle signals TG_S1 and TG_S2 may not toggle according to the predetermined cycle, but instead remain fixed at a high or low logic level over two or more cycles.

The toggle signal monitor 200 may be configured to generate and provide a final fault search signal CON_S in response to the first toggle signal TG_S1 and the second toggle signal TG_S2. In an example embodiment, the toggle signal monitor 200 may include a first XOR gate configured to provide a first error occurrence signal in response to the first and second toggle signals TG_S1 and TG_S2, a second XOR gate configured to provide a second error occurrence signal in response to the first and second toggle signals TG_S1 and TG_S2, a first output gate configured to provide a first fault search signal in response to the first and second error occurrence signals, and a second output gate configured to provide a second fault search signal in response to the first and second error occurrence signals.

Thus, the toggle signal monitor 200 may receive information indicating whether or not the master signal M_S correctly correlates with the comparison signal C_S from the first and second toggle signals TG_S1 and TG_S2. Because the toggle signal monitor 200 provides the final fault search signal CON_S in response to the first and second toggle signals TG_S1 and TG_S2, the final fault search signal CON_S may include the information about whether the master signal M_S correctly correlates with the comparison signal C_S.

In an example embodiment, a predetermined error signal (not shown in FIG. 1) may be further applied to the toggle signal monitor 200. For example, the first XOR gate included in the toggle signal monitor 200 may provide the first error occurrence signal in response to the error signal, and the second XOR gate included in the toggle signal monitor 200 may provide the second error occurrence signal in response to the error signal. When the toggle signal monitor 200 provides the final fault search signal CON_S in response to the predetermined error signal and the first and second toggle signals TG_S1 and TG_S2, the final fault search signal CON_S may be further predicated upon information regarding whether or not the gates included in at least one of the toggle signal generator 100 and the toggle signal monitor 200 are faulty.

Figure 2:
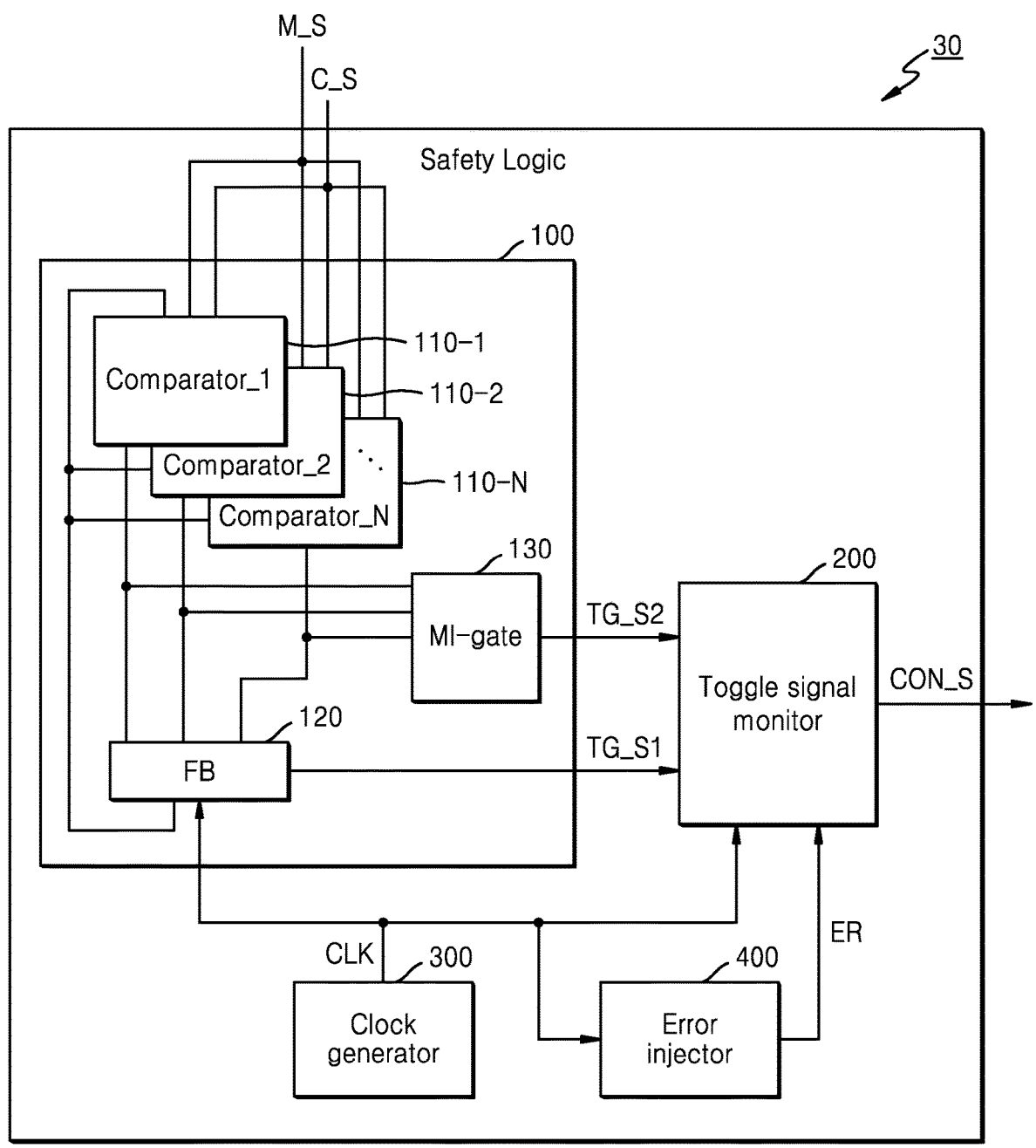
FIG. 2 is a block diagram further illustrating in one example the safety logic of FIG. 1 according to embodiments of the inventive concept.

FIG. 2 is a block diagram further illustrating in one example the safety logic 30 of FIG. 1 according to an embodiment of the inventive concept.

Referring to FIG. 2, the safety logic 30 again comprises the toggle signal generator 100 and the toggle signal monitor 200, but further comprises a clock generator 300, and an error injector 400. The toggle signal generator 100 may include a plurality of comparators 110-1 to 110-N, where 'N' is a positive integer greater than 1. The toggle signal generator may also include a feedback (FB) path 120 and a first multiple input (MI) gate 130.

Each of the comparators 110-1 to 110-N receive the master signal M_S and comparison signal C_S, and perform a comparison operation between the master signal M_S and the comparison signal C_S. For example, each of the master signal M_S and the comparison signal C_S may include a plurality of bits, and each of the bits of the master signal M_S as well as analogous bits of the comparison signal C_S may be applied to each of the comparators 110-1 to 110-N. In this manner, the toggle signal generator 100 may determine whether the master signal M_S correctly correlates with (i.e., is equal to) the comparison signal C_S on a bit-for-bit basis using the comparators 110-1 to 110-N.

The feedback path 120 may generate a first toggle signal TG_S1 in response to a comparison result provided by each of the comparators 110-1 to 110-N, and output feedback signal(s) to each of the comparators 110-1 to 110-N. In the illustrated example of FIG. 2, the feedback path 120 also receives a clock signal CLK from the clock generator 300.

In one embodiment, the feedback path 120 may include a second multiple input gate configured to generate the first toggle signal TG_S1 in response to the comparison result provided by the comparators 110-1 to 110-N. Here, the second multiple input gate may be an AND gate or an OR gate.

With this configuration, the feedback path 120 may delay the first toggle signal TG_S1 in response to the clock signal CLK, and provide a delay signal as the feedback signal to the comparators 110-1 to 110-N. After a feedback operation is performed on the comparators 110-1 to 110-N by the feedback path 120, and when the master signal M_S correctly correlates with the comparison signal C_S, each of the first toggle signal TG_S1 and the second toggle signal TG_S2 will be provided as a normal toggle signal.

The first multiple input gate 130 may be used to generate the second toggle signal TG_S2 in response to the comparison result of the comparators 110-1 to 110-N. In one embodiment, the first multiple input gate 130 may an AND gate or an OR gate. In another embodiment, the first multiple input gate 130 may be an AND gate, and the second multiple input gate included in the feedback path 120 may be an OR gate. In still another embodiment, the first multiple input gate 130 may be an OR gate, and the second multiple input gate included in the feedback path 120 may be an AND gate.

As illustrated in FIG. 2, the toggle signal monitor 200 receives the first and second toggle signals TG_S1 and TG_S2 generated by the toggle signal generator 100. The toggle signal monitor 200 also receives the clock signal CLK from the clock generator 300 and an error signal ER from the error injector 400.

With these inputs, the toggle signal monitor 200 may perform a monitoring operation on the first and second toggle signals TG_S1 and TG_S2. In one embodiment, the toggle signal monitor 200 may perform a monitoring operation on the first and second toggle signals TG_S1 and TG_S2 in response to the clock signal CLK and the error signal ER in order to provide the final fault search signal CON_S.

The final fault search signal CON_S may be provide in response to the first and second toggle signals TG_S1 and TG_S2 and include information indicating whether or not the master signal M_S correctly correlates with the comparison signal C_S. Here, the final fault search signal CON_S may be provided further in response to the clock signal CLK and the error signal ER in order to further include information indicating whether or not gates included in the toggle signal generator 100 and the toggle signal monitor 200 are faulty.

The clock generator 300 may include, for example, a phase-locked loop (PLL). Although the present embodiment describes a case in which the safety logic 30 includes the clock generator 300, the inventive concept is not limited thereto. In another example, a clock generator may be provided outside the safety logic 30, and the feedback path 120, the toggle signal monitor 200, and the error injector 400 may receive a clock signal from the outside.

The error injector 400 may be used to generate and provide the error signal ER in response to the clock signal CLK. In one embodiment, the error injector 400 may include a clock divider configured to divide the clock signal CLK. Thus, the error signal ER may be a divided clock signal.

As will be appreciated by those skilled in the art, the safety logic 30 may be variously implemented. That is, the safety logic 30 may be implemented in software and/or hardware. In certain embodiments, the safety logic 30 may be implemented as hardware, wherein each of components included in the safety logic 30 may include various circuits configured to perform the above-described operations. However, in other embodiments the safety logic 30 may be implemented as software, programs and/or commands loaded in a memory (not shown) and executed by a processor (not shown) to perform the above-described operations. Still other embodiments may use a combination of hardware and software to implement the safety logic 30.

Figure 3:
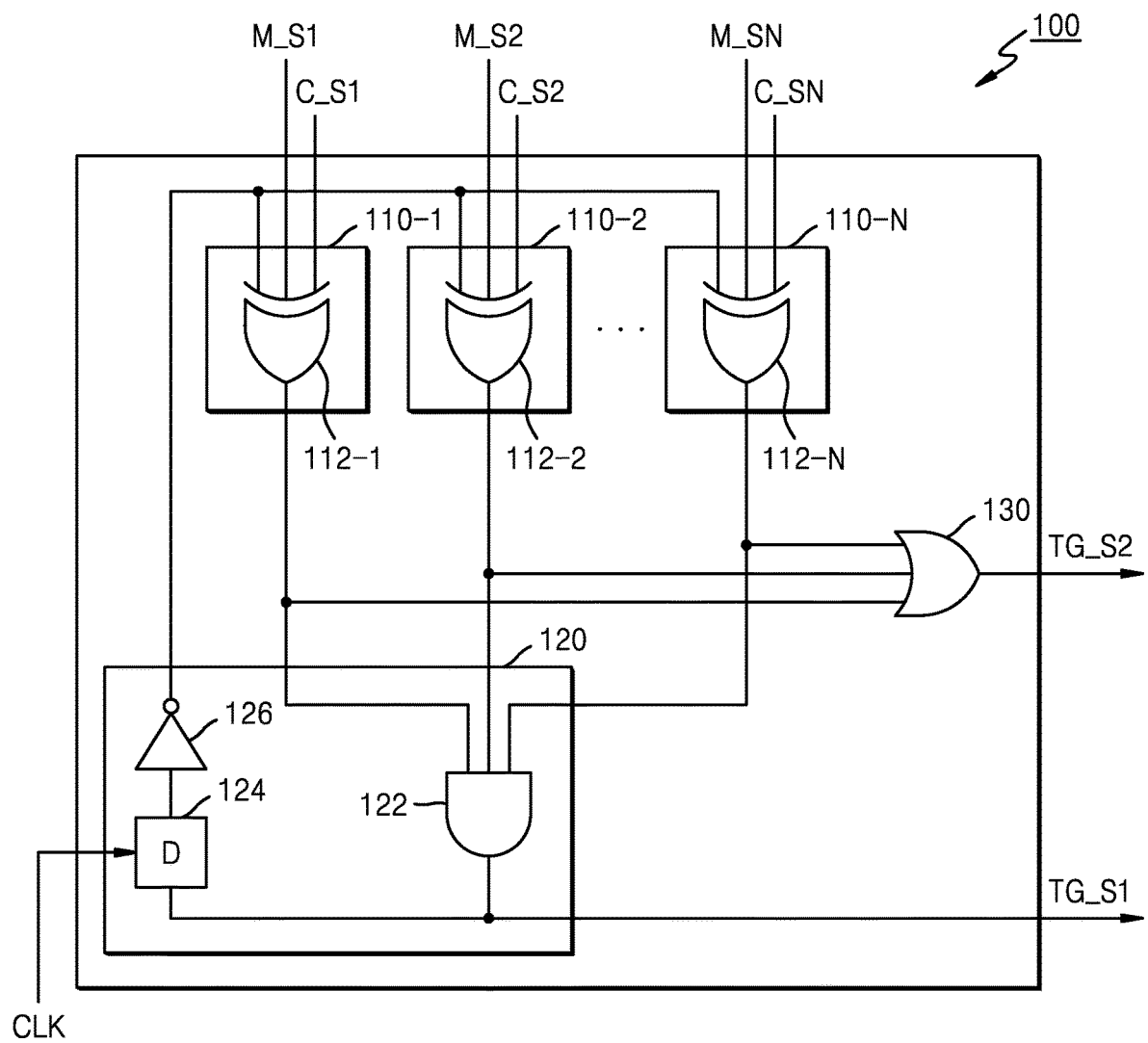
FIG. 3 is a block diagram further illustrating in one example the toggle signal generator of FIG. 2 according to embodiments of the inventive concept.

FIG. 3 is a block diagram further illustrating in one example the toggle signal generator 100 of FIGS. 1 and/or 2 according to embodiments of the inventive concept.

Referring to FIG. 3, the comparators 110-1 to 110-N may include XOR gates 112-1 to 112-N, respectively. Also, the feedback path 120 may include a second multiple input gate 122, a first delay circuit 124, and an inverter 126.

The second multiple input gate 122 may generate a first toggle signal TG_S1 in response to outputs of the XOR gates 112-1 to 112-N. Also, the first multiple input gate 130 may generate a second toggle signal TG_S2 in response to the outputs of the XOR gates 112-1 to 112-N. The first multiple input gate 130 may include an OR gate, and the second multiple input gate 122 may include an AND gate.

The first delay circuit 124 may delay the first toggle signal TG_S1 in response to a clock signal CLK. For example, the first delay circuit 124 may include a flip-flop configured to operate in response to the clock signal CLK. The inverter 126 may invert an output of the first delay circuit 124 and provide the inverted output as a feedback signal to the XOR gates 112-1 to 112-N.

Each of the XOR gates 112-1 to 112-N may receive each bit of a master signal M_S and each bit of a comparison signal C_S. Also, each of the XOR gates 112-1 to 112-N may receive the feedback signal output by the inverter 126. In a specific embodiment, a first XOR gate 112-1 may receive a first master signal bit M_S1, a first comparison signal bit C_S1, and the feedback signal and perform an XOR operation in response to the first master signal bit M_S1, the first comparison signal bit C_S1, and the feedback signal.

Figure 4:
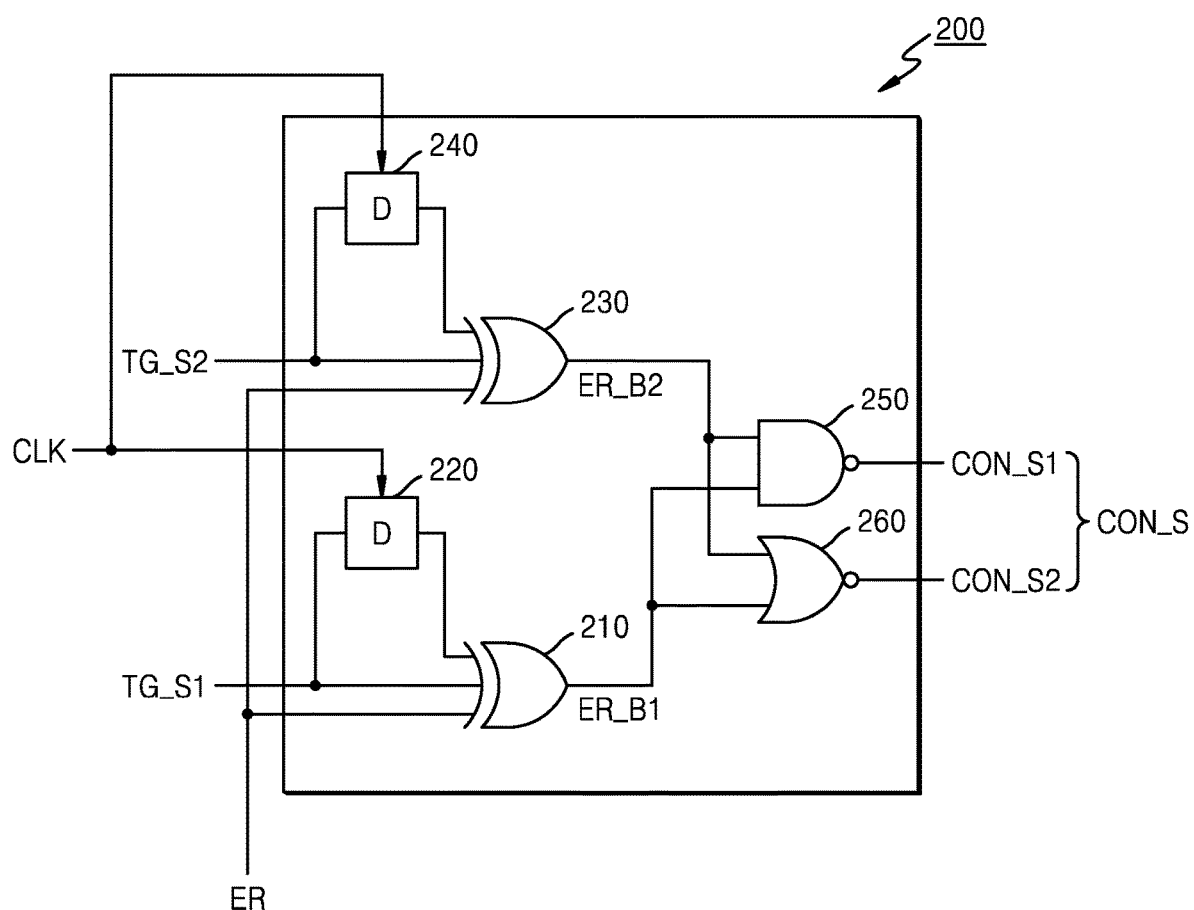
FIG. 4 is a block diagram further illustrating in one example the toggle signal monitor of FIGS. 1 and 3 according to embodiments of the inventive concept.

FIG. 4 is a block diagram further illustrating in one example the toggle signal monitor 200 of FIGS. 1 and/or 2 according to embodiments of the inventive concept.

Referring to FIG. 4, the toggle signal monitor 200 may include a first XOR gate 210, a second delay circuit 220, a second XOR gate 230, a third delay circuit 240, a first output gate 250, and a second output gate 260. The first XOR gate 210 may receive an error signal ER, a first toggle signal TG_S1, and the first toggle signal TG_S1 delayed by the second delay circuit 220 and perform an XOR operation in response to the error signal ER, the first toggle signal TG_S1, and the delayed first toggle signal TG_S1. The second delay circuit 220 may delay the first toggle signal TG_S1 in response to a clock signal CLK. Thus, the first XOR gate 210 may provide the first error occurrence signal ER_B1.

The second XOR gate 230 may receive the error signal ER, a second toggle signal TG_S2, and the second toggle signal TG_S2 delayed by the third delay circuit 240 and perform an XOR operation in response to the error signal ER, the second toggle signal TG_S2, and the delayed second toggle signal TG_S2. The third delay circuit 240 may delay the second toggle signal TG_S2 in response to the clock signal CLK. Thus, the second XOR gate 230 may provide the second error occurrence signal ER_B2.

The first output gate 250 may provide a first fault search signal CON_S1 in response to the first and second error occurrence signals ER_B1 and ER_B2. Also, the second output gate 260 may provide a second fault search signal CON_S2 in response to the first and second error occurrence signals ER_B1 and ER_B2. Collectively or singularly, the first fault search signal CON_S1 and the second fault search signal CON_S2 may constitute the final fault search signal CON.

In one embodiment, the first output gate 250 may include a NAND gate. Also, the second output gate 260 may include a NOR gate. The toggle signal monitor 200 may communicate information regarding whether or not the master signal M_S correctly correlates with the comparison signal C_S to one or more components external to the toggle signal monitor 200 using a combination of the first and second fault search signals CON_S1 and CON_S2 included in the final fault search signal CON_S. Also, the toggle signal monitor 200 may further communicate information indicating whether or not the gates included in the toggle signal generator 100 and the toggle signal monitor 200 are faulty to external components using the combination of the first and second fault search signals CON_S1 and CON_S2.

Figure 5:
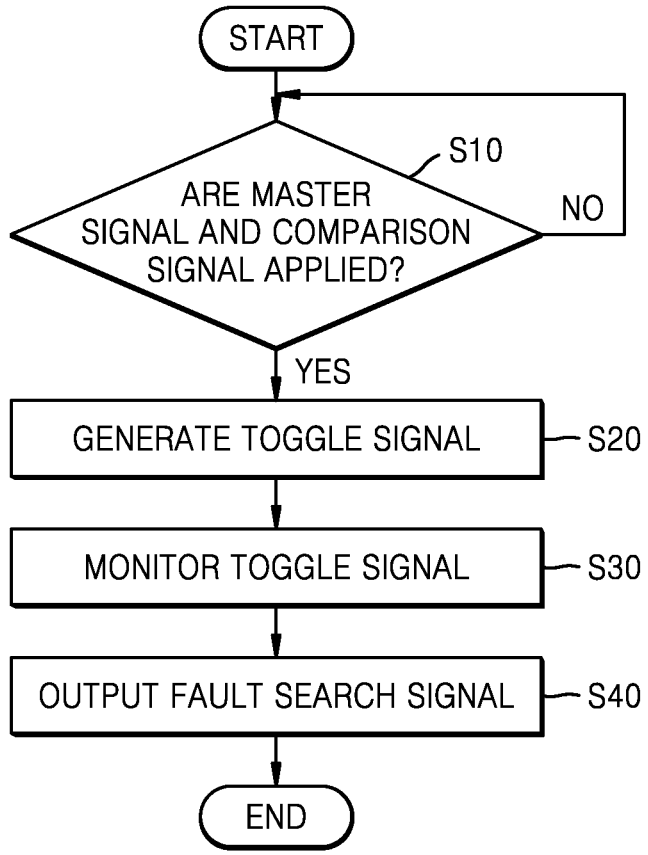
FIG. 5 is a flowchart summarizing a method of operating an apparatus according to embodiments of the inventive concept.

FIG. 5 is a flowchart summarizing in one example a method of operating the apparatus 1 of FIG. 1 according to example embodiments of the inventive concept. The flowchart of FIG. 5 will be described in the context of the embodiments previously described with reference to FIGS. 1, 2 and 3.

Referring to FIGS. 1, 2 and 5, the apparatus 1 determines whether the master signal M_S and the comparison signal C_S are applied to the toggle signal generator 100 (S10). Here, the master signal M_S may be provided by the first function module 10 and the comparison signal C_S may be provided by the second function module 20.

Accordingly, the apparatus 1 may generate the first and second toggle signals TG_S1 and TG_S2 in response to the master signal M_S and the comparison signal C_S (S20). For example, assuming the safety logic 30 of FIG. 2, the toggle signal generator 100 may generate the first and second toggle signals TG_S1 and TG_S2 in response to the master signal M_S and the comparison signal C_S using the plurality of comparators 110-1 to 110-N and the feedback path 120.

The apparatus 1 may monitor the generated first and second toggle signals TG_S1 and TG_S2 (S30). Here, the safety logic 30 included in the apparatus 1 may include a toggle signal monitor 200 like the one described with reference to FIG. 3 that is configured to monitor the first and second toggle signals TG_S1 and TG_S2. The toggle signal monitor 200 may provide the final fault search signal CON_S in response to the first and second toggle signals TG_S1 and TG_S2 (S40). The safety logic 30 may generate information indicating whether or not the master signal M_S correctly correlates with the comparison signal C_S in response to the final fault search signal CON_S provided by the monitoring the first and second toggle signals TG_S1 and TG_S2.

Figure 6:
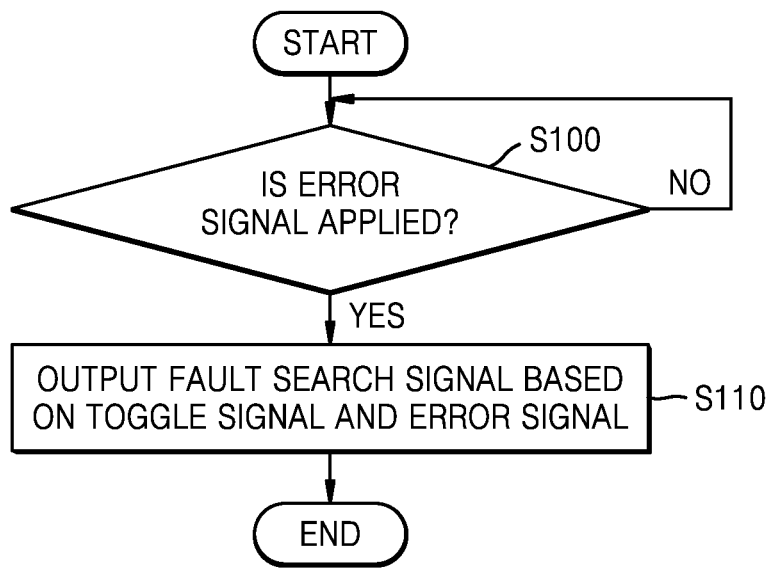
FIG. 6 is a flowchart summarizing a method of operating a toggle signal monitor, according to embodiments of the inventive concept.

FIG. 6 is another flowchart summarizing in one example a method of operating the toggle signal monitor 200 according to embodiments of the inventive concept.

Referring to FIGS. 2, 3, 4 and 6, the toggle signal monitor 200 may determine whether the error signal ER is applied to the toggle signal monitor 200 (S100). For example, the error signal ER may be a signal that indicates whether or not the gates included in each of a toggle signal generator 100 and the toggle signal monitor 200 are faulty. For example, the error signal ER may toggle signal. In one embodiment, the error signal ER may be provided by an error injector 400 included in an apparatus 1, and the error injector 400 may provide the error signal ER in response to a clock signal CLK.

When the error signal ER is applied to the toggle signal monitor 200, the toggle signal monitor 200 may provide the final fault search signal CON_S in response to the first toggle signal TG_S1, the second toggle signal TG_S2, and the error signal ER (S110). For example, the toggle signal monitor 200 may provide the first fault search signal CON_S1 and the second fault search signal CON_S2 as the final fault search signal CON_S, where the first fault search signal CON_S1 is generated by performing a NAND operation on first and second error occurrence signals ER_B1 and ER_B2, and the second fault search signal CON_S2 is generated by performing a NOR operation on the first and second error occurrence signals ER_B1 and ER_B2. However, the logic combination(s) for each of the first fault search signal CON_S1 and the second search signal CON_S2 may vary depending on the logic state of the error signal ER, whether or not the master signal M_S correctly correlates with the comparison signal C_S, and whether or not the gates included in each of the toggle signal generator 100 and the toggle signal monitor 200 are faulty.

Therefore, according to certain embodiments of the inventive concept, the apparatus 1 including safety logic 30 may provide, as the final fault search signal CON_S, not only information indicating whether or not the master signal M_S correctly correlates with the comparison signal C_S, but also information indicating whether or not the gates included in each of the toggle signal generator 100 and the toggle signal monitor 200 are faulty. Further all this information may be provided during run-time operation without necessarily suspending operation of the apparatus or components of the apparatus. In this manner, the apparatus 1 may accurately detect a potential latent fault during run-time operation, thereby improving performance and operating stability.

FIG. 7 is a timing diagram illustrating an exemplary set of timing relationships that may exist between of various signals described in the foregoing embodiment(s). Here, it is assumed that the error signal ER is derived by dividing the clock signal CLK by four (4). Those skilled in the art will recognize that the nature and origin of these signals, as well as their timing relationship(s) are merely illustrative.

Referring to FIG. 7, it is assumed that at time t1 the first toggle signal TG_S1 is abnormally provided. This abnormal output of the first toggle signal TG_S1 may be a result from a difference between at least one bit of the master signal M_S and at least one bit of the comparison signal C_S. Specifically, the first toggle signal TG_S1 may remain fixed at logic low and output from the first time point t1 to a second time point t2. In response to the abnormal first toggle signal TG_S1, the first error occurrence signal ER_B1 is output at logic low from the first time point t1 to the second time point t2. Also, a first fault search signal CON_S1 may be output at logic high, and a second fault search signal CON_S2 may be output at logic low from the first time point t1 to the second time point t2.

The first toggle signal TG_S1 and the second toggle signal TG_S2 are normally output from the second time point t2 to a third time point t3. When the first toggle signal TG_S1 and the second toggle signal TG_S2 are normally output, the first error occurrence signal ER_B1 and the second error occurrence signal ER_B2 may be output at logic high from the second time point t2 to the third time point t3. Also, the first fault search signal CON_S1 may be output at logic low, and the second fault search signal CON_S2 may be output at logic high.

The second toggle signal TG_S2 may be abnormally output at the third time point t3. For example, the abnormal output of the second toggle signal TG_S2 may result from a difference between at least one bit of the master signal M_S and at least one bit of the comparison signal C_S. Specifically, the second toggle signal TG_S2 remains fixed to logic high from the third time point t3 to a fourth time point t4. In response to the second toggle signal TG_S2 being fixed to logic high, the second error occurrence signal ER_B2 may be output at logic low from the third time point t3 to a fourth time point t4. Also, the first fault search signal CON_S1 may be output at logic high, and the second fault search signal CON_S2 may be output at logic low from the third time point t3 to the fourth time point t4.

FIG. 8A is a first table TB1 indicating values for each of first and second fault search signals CON_S1 and CONS_S2 according to values of an error signal ER and depending on whether the master signal M_S correctly correlates with the comparison signal C_S. FIG. 8B is a second table TB2 indicating values of first and second fault search signals CON_S1 and CON_S2 depending on whether each of gates included in a toggle signal generator 100 and a toggle signal monitor 200 is faulty and according to fault-type cases and values of an error signal ER.

Referring to FIG. 8A, when the error signal ER has a value of 0 (or logic low) and the master signal M_S correctly correlates with the comparison signal C_S, each of the first and second fault search signals CON_S1 and CON_S2 may have a value of 0. When the error signal ER has a value of 0 and at least one bit of the master signal M_S is different from that of the comparison signal C_S, each of the first and second fault search signals CON_S1 and CON_S2 may have a value of 1 (or logic high).

When a value of the error signal ER has a value of 1 and the master signal M_S correctly correlates with the comparison signal C_S, each of the first and second fault search signals CON_S1 and CON_S2 may have a value of 1. When the error signal ER has a value of 1 and at least one bit of the master signal M_S is different from that of the comparison signal C_S, each of the first and second fault search signals CON_S1 and CON_S2 may have a value of 0.

Referring to FIG. 8B, a first case assumes that a gate is faulty and that the output of the gate is fixed at 0, and a second case assumes that a gate is faulty and that the output of the gate is fixed at 1. For example, when the value of the error signal ER is 0 and at least one of XOR gates 112-1 to 112-N is faulty and corresponds to the first case, the first fault search signal CON_S1 may have a value of 1, and the second fault search signal CON_S2 may have a value of 0. Also, when the value of the error signal ER is 1 and at least one of the XOR gates 112-1 to 112-N is faulty and corresponds to the first case, each of the first and second fault search signals CON_S1 and CON_S2 may have a value of 0.

For example, when the value of the error signal ER is 0 and at least one of the XOR gates 112-1 to 112-N is faulty and corresponds to the second case, the first fault search signal CON_S1 may have a value of 1 and the second fault search signal CON_S2 may have a value of 0. Also, when the value of the error signal ER is 1 and at least one of the XOR gates 112-1 to 112-N is faulty and corresponds to the second case, each of the first and second fault search signals CON_S1 and CON_S2 may have a value of 0.

Although only the values of the first and second fault search signals CON_S1 and CON_S2 in each of the first and second cases in which the XOR gates 112-1 to 112-N are faulty have been described, the same interpretation as described above may be applied to a case in which each of other gates included in the second table TB2 is faulty. For example, when the value of the error signal ER is 0 and a first XOR gate 210 is faulty and corresponds to the first case, a first fault search signal CON_S1 may have a value of 1 and a second fault search signal CON_S2 may have a value of 0. Also, when the value of the error signal ER is 1 and the first XOR gate 210 is faulty and corresponds to the first case, each of the first and second fault search signals CON_S1 and CON_S2 may have a value of 0.

As described above, in each situation, values of the first and second fault search signals CON_S1 and CON_S2 may be prepared for the first and second tables TB1 and TB2 in response to the error signal ER in which a value of 0 and a value of 1 are repeated (or logic low and logic high are repeated) in a predetermined cycle. Thus, the first and second fault search signals CON_S1 and CON_S2 may include information indicating whether or not the master signal M_S correctly correlates with the comparison signal C_S. In addition, the first and second fault search signals CON_S1 and CON_S2 may further include information indicating whether or not gates included in each of the toggle signal generator 100 and the toggle signal monitor 200 are faulty.

Figure 9:
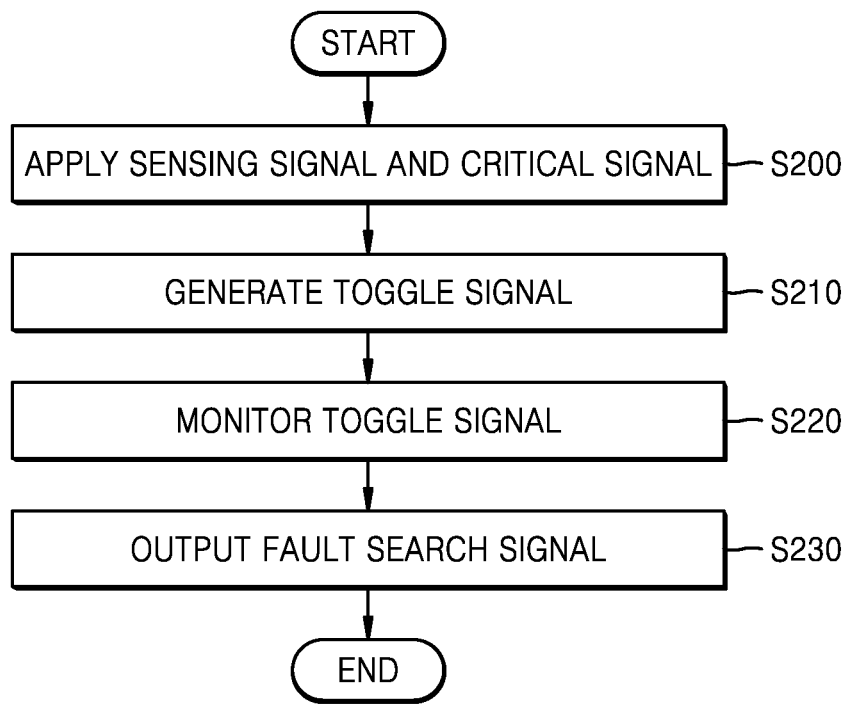
FIG. 9 is a flowchart summarizing a method of operating an apparatus according to embodiments of the inventive concept.

FIG. 9 is a flowchart summarizing in one example a method of operating the apparatus 1 of FIG. 1 according to an embodiments of the inventive concept.

Referring to FIGS. 1 and 9, the apparatus 1 may apply a sensing signal and a critical signal to the safety logic 30 (S200). In one example, the apparatus 1 may apply the sensing signal as the master signal M_S to the safety logic 30, and further apply the critical signal as the comparison signal C_S to the safety logic 30. The sensing signal may be the output of a sensor indicating a particular condition associated with the apparatus 1.

In one example, the first function module 10 may be a temperature sensor providing a temperature sensing signal as the master signal M_S to the safety logic 30, and the second function module 20 may be a circuit providing a critical signal (or limit value) derived from pre-set temperature condition information as the comparison signal C_S to the safety logic 30. In another example, the first function module 10 may be a power sensor (e.g., a voltage, current, signal waveform sensor) providing a power sensing signal as the master signal M_S to the safety logic 30, and the second function module 20 may be a circuit providing a critical signal (or limit value) derived from pre-set power condition information as the comparison signal C_S to the safety logic 30.

Next, the apparatus 1 may generate first and second toggle signals TG_S1 and TG_S2 in response to the sensing signal and the critical signal (i.e., in response to the master signal M_S and the comparison signal C_S) (S210). The safety logic 30 included in the apparatus 1 may include a toggle signal generator 100 like the one described in relation to FIGS. 1 and 2, and configured to provide the first and second toggle signals TG_S1 and TG_S2, which vary depending on whether the sensing signal correctly correlates with the critical signal.

Next, the apparatus 1 may monitor the generated first and second toggle signals TG_S1 and TG_S2 (S220). The safety logic 30 included in the apparatus 1 may include a toggle signal monitor 200 like the one described in relation to FIGS. 1 and 3, and configured to monitor the first and second toggle signals TG_S1 and TG_S2. The toggle signal monitor 200 may provide the final fault search signal CON_S in response to the first and second toggle signals TG_S1 and TG_S2 (S230). That is, the safety logic 30 may generate information indicating whether or not the sensing signal correctly correlates with the critical signal in response to the final fault search signal CON_S provided by monitoring the sensing signal and the critical signal.

Figure 10:
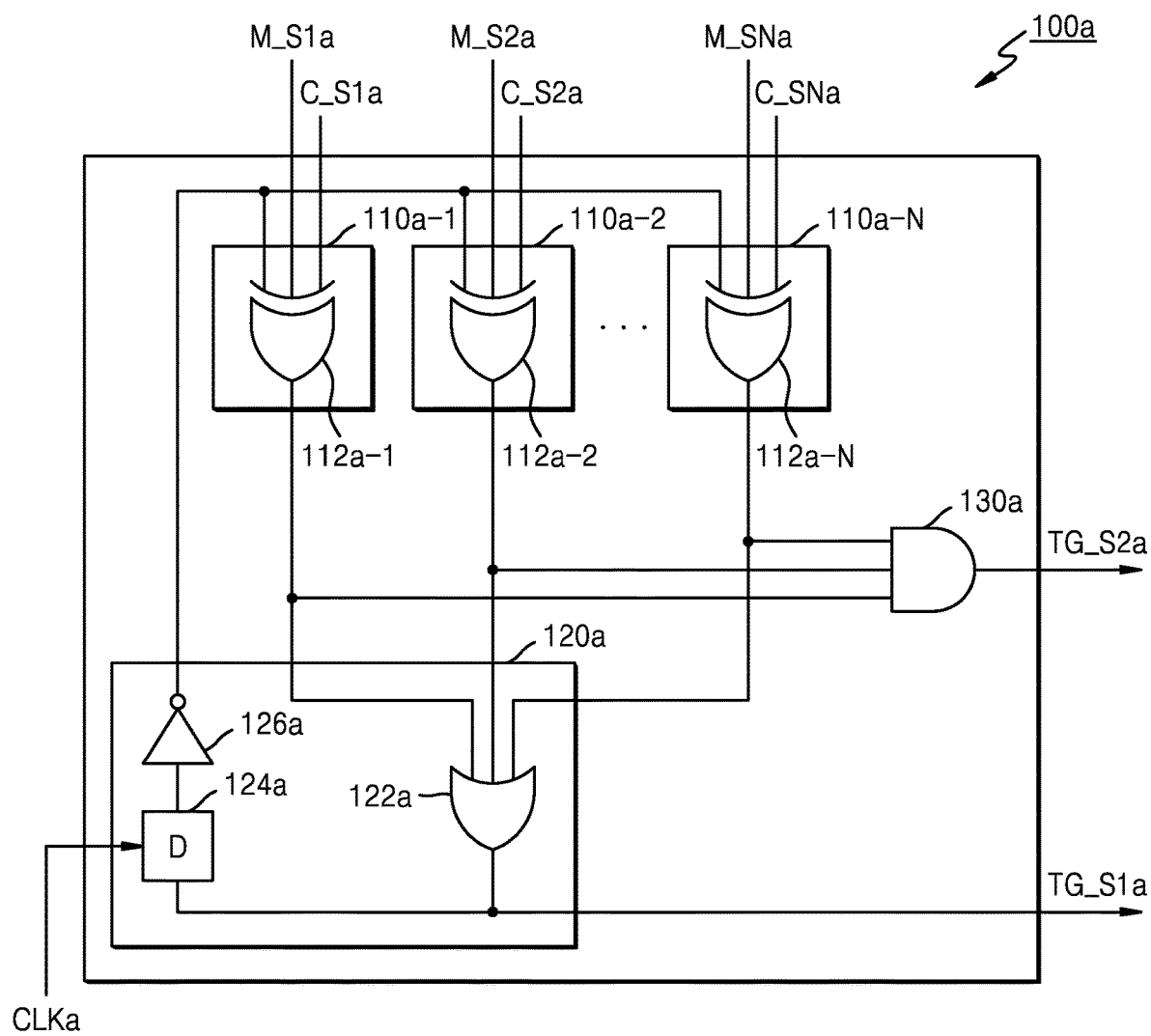
FIG. 10 is a block diagram further illustrating a toggle signal generator according to embodiments of the inventive concept.

FIG. 10 is a block diagram further illustrating in another example (100a) the toggle signal generator 100 of FIG. 1 according to embodiments of the inventive concept. The configuration of the toggle signal generator 100a shown in FIG. 10 is generally similar to that of the toggle signal generator 100 described with reference to FIG. 3. However, a first multiple input gate 130a may include an AND gate, and a second multiple input gate 122a may include an OR gate. Thus, the first multiple input gate 130a may perform an AND operation on outputs of XOR gates 112a-1 to 112a-N and generate a second toggle signal TG_S2a.

The second multiple input gate 122a may perform an OR operation on the outputs of the XOR gates 112a-1 to 112a-N and generate a first toggle signal TG_S1a. Also, a first delay circuit 124a may delay a first toggle signal TG_S1a in response to a clock signal CLKa, and an inverter 126a may invert an output of the first delay circuit 124a, generate a feedback signal, and provide the generated feedback signal to the XOR gates 112a-1 to 112a-N.

Figure 11:
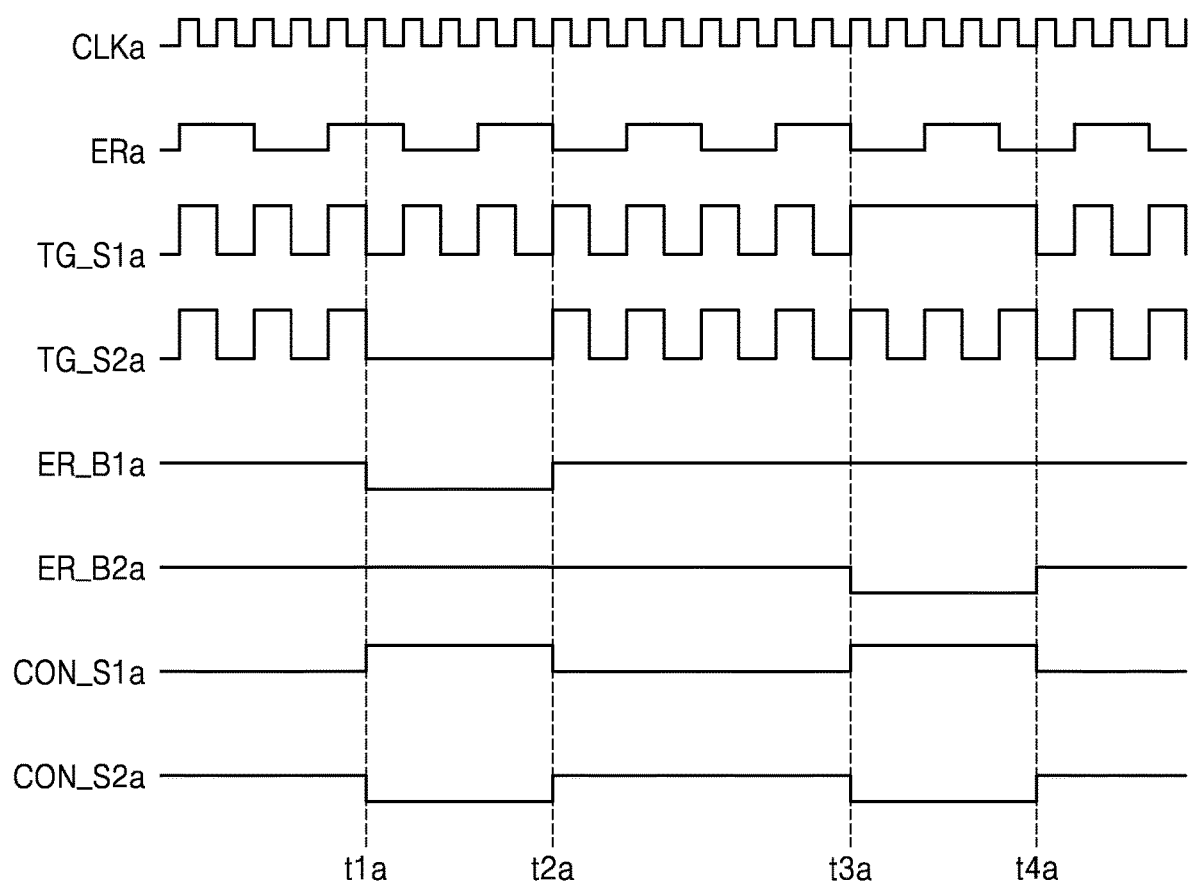
FIG. 11 is a timing diagram illustrating exemplary signal timing relationships according to embodiments of the inventive concept.

FIG. 11 is a timing diagram illustrating an exemplary set of timing relationships that may exist between of various signals described in relation to the embodiment of FIG. 10.

The timing diagram of FIG. 11 is generally similar to the timing diagram of FIG. 7. For example, the timing diagram of FIG. 11 illustrates each signal when the same master signal and comparison signal as in the embodiment of FIG. 7 are applied. However, referring to the timing diagram of FIG. 11, a second toggle signal TG_S2a may be fixed to logic low and output from a first time point t1a to a second time point t2a, and a first toggle signal TG_S1a may be fixed to logic high and output from a third time point t3a to a fourth time point t4a.

Figure 12:
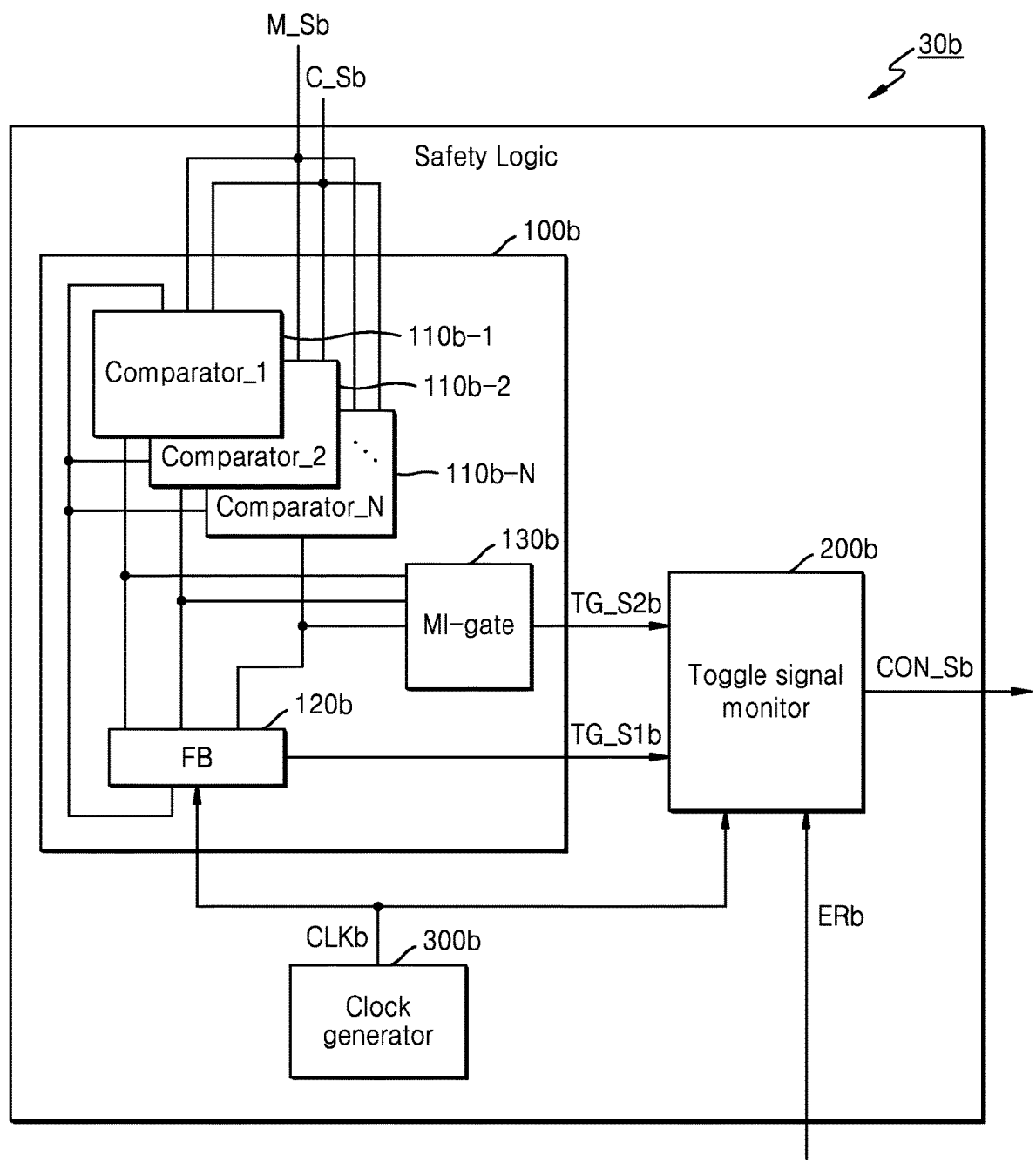
FIG. 12 is a block diagram illustrating safety logic illustrating exemplary signal timing relationships according to embodiments of the inventive concept.

FIG. 12 is a block diagram further illustrating in another example (30b) the safety logic 30 of FIG. 1 according to an embodiments of the inventive concept. Here, the configuration of the safety logic 30b in FIG. 12 is generally similar to that of the safety logic 30 described with reference to FIG. 2.

Of note, the safety logic 30 of FIG. 2 included an internally disposed error injector 400 providing the error signal ER. In contrast, the safety logic 30b of FIG. 12 receives an externally generated error signal ERb (e.g., an error signal supply source). However, the externally generated error signal ERb may be a toggle signal having a cycle longer than that of a clock signal CLKb generated by the clock generator 300b.

Figure 13:
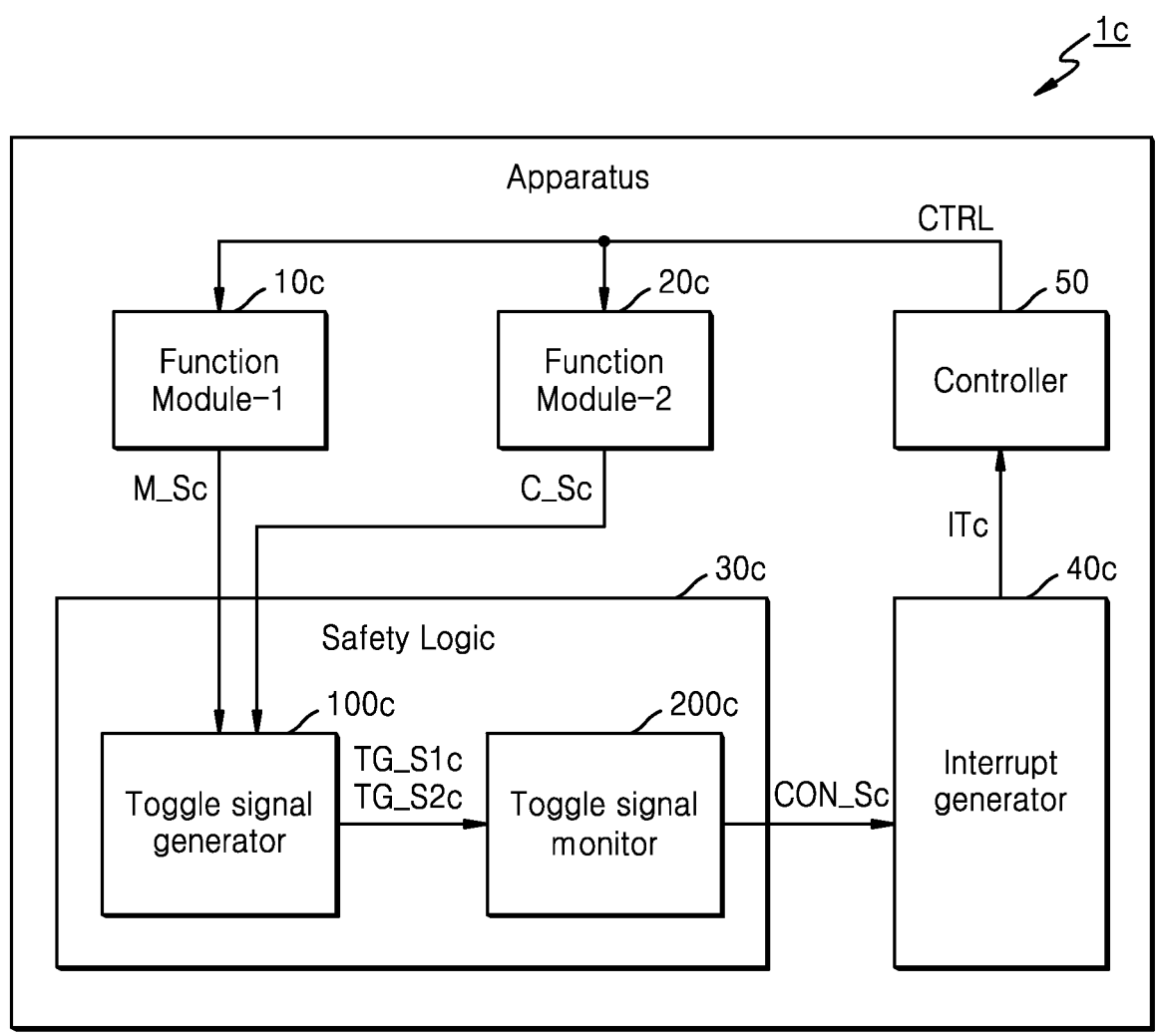
FIG. 13 is a block diagram illustrating an apparatus illustrating exemplary signal timing relationships according to embodiments of the inventive concept.

FIG. 13 is a block diagram of an apparatus 1c according to an embodiments of the inventive concept. Here, the configuration of the apparatus 1c in FIG. 13 is generally similar to that of the apparatus 1 described with reference to FIG. 1. However, the apparatus 1c further includes a controller 50 and an interrupt generator 40c, where the interrupt generator 40c is used to generate an interrupt signal ITc applied to the controller 50 in response to the final fault search signal CON_S.

Here, the controller 50 is assumed to control (CTRL) the overall operation of the first function module 10c and the second function module 20c. It is further assumed that the controller 50 is responsive in its operation to the interrupt signal ITc conditionally provided by the interrupt generator 40c.

For example, the interrupt generator 40c may obtain information indicating whether or not the master signal M_Sc correctly correlates with the comparison signal C_Sc in response to the final fault search signal CON_Sc. The interrupt generator 40c may also obtain information indicating whether or not a gate included in the toggle signal generator 100c and the toggle signal monitor 200c is faulty in response to the final fault search signal CON_Sc.

Of further note in certain embodiments, the interrupt generator 40c may operate consistent with the first table TB1 of FIG. 8A to provide information indicating whether or not the master signal M_Sc correctly correlates with the comparison signal C_Sc in response to the final fault search signal CON_Sc. Thus, when it is determined that at least one bit of the master signal M_Sc is different from that of the comparison signal C_Sc, the interrupt generator 40c may provide the interrupt signal ITc in response to the determination result. Further, when the first function module 10c provides the master signal M_Sc as a sensing signal and the second function module 20c provides the comparison signal C_Sc as a critical signal, it may be determined that the master signal M_Sc correctly correlates with the comparison signal C_Sc, and the interrupt generator 40c may provide the interrupt signal ITc in response to the determination result.

Also in certain embodiments, the interrupt generator 40c may operate consistent with the second table TB2 of FIG. 8B to obtain information indicating whether or not any of the gates included in the toggle signal generator 100c and the toggle signal monitor 200c is faulty, in response to the final fault search signal CON_Sc. Thus, it may be determined that at least one of the gates included in the toggle signal generator 100c and the toggle signal monitor 200c is faulty, and the interrupt generator 40c may provide the interrupt signal ITc in response to the determination result.

For example, the interrupt generator 40c may provide the interrupt signal ITc to a controller (not shown) included in the apparatus 1c. Alternatively, the interrupt generator 40c may provide the interrupt signal ITc to a superordinate controller located outside the apparatus 1c.

Figure 14:
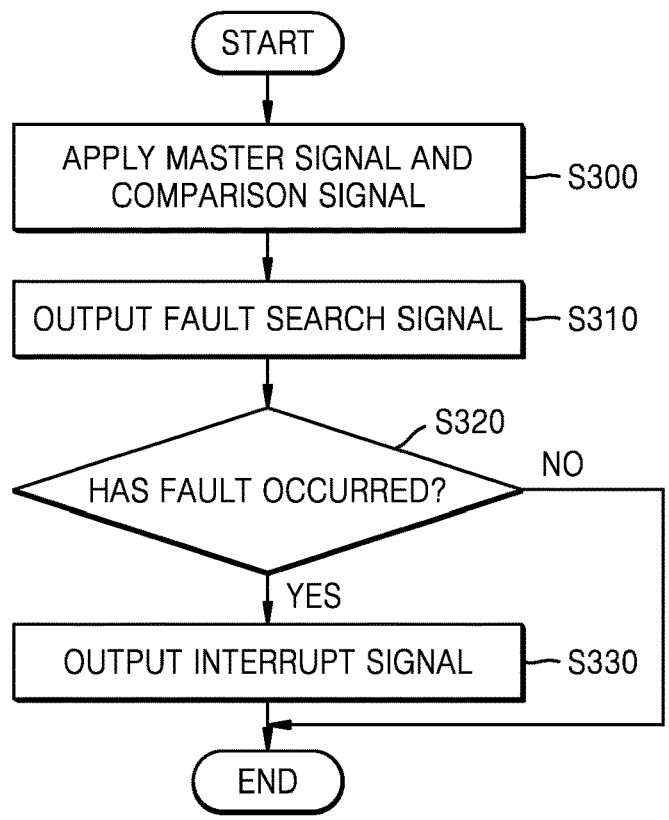
FIG. 14 is a flowchart summarizing a method of operating an apparatus illustrating exemplary signal timing relationships according to embodiments of the inventive concept.

FIG. 14 is a flowchart summarizing in one example a method of operating the apparatus 1c of FIG. 13 according to embodiments of the inventive concept.

Referring to FIGS. 13 and 14, the apparatus 1c may apply the master signal M_Sc and the comparison signal C_Sc to the safety logic 30c (S300). The safety logic 30c may include the toggle signal generator 100c and the toggle signal monitor 200c. The toggle signal generator 100c may provide the first and second toggle signals TG_S1c and TG_S2c in response to the master signal M_Sc and the comparison signal C_Sc, and the toggle signal monitor 200c may provide a final fault search signal CON_Sc in response to the first and second toggle signals TG_S1c and TG_S2c (S310).

An interrupt generator 40c may determine whether a fault has occurred in response to the final fault search signal CON_Sc (S320). For example, when it is determined in response to the fault search signal CON_Sc that at least one bit of the master signal M_Ss is different from that of the comparison signal C_Sc, the interrupt generator 40c may determine that the fault has occurred. Alternatively, when it is determined in response to the fault search signal CON_Sc that at least one of gates included in the toggle signal generator 100c and the toggle signal monitor 200c is faulty, the interrupt generator 40c may determine that the fault has occurred.

When the fault occurs, the interrupt generator 40c may provide an interrupt signal ITc (S330). For example, the apparatus 1c may include a controller configured to control components of the apparatus 1c, and the interrupt generator 40c may provide the interrupt signal ITc to the controller. Also, the interrupt generator 40c may provide the interrupt signal ITc to the outside of the apparatus 1c.

Figure 15:
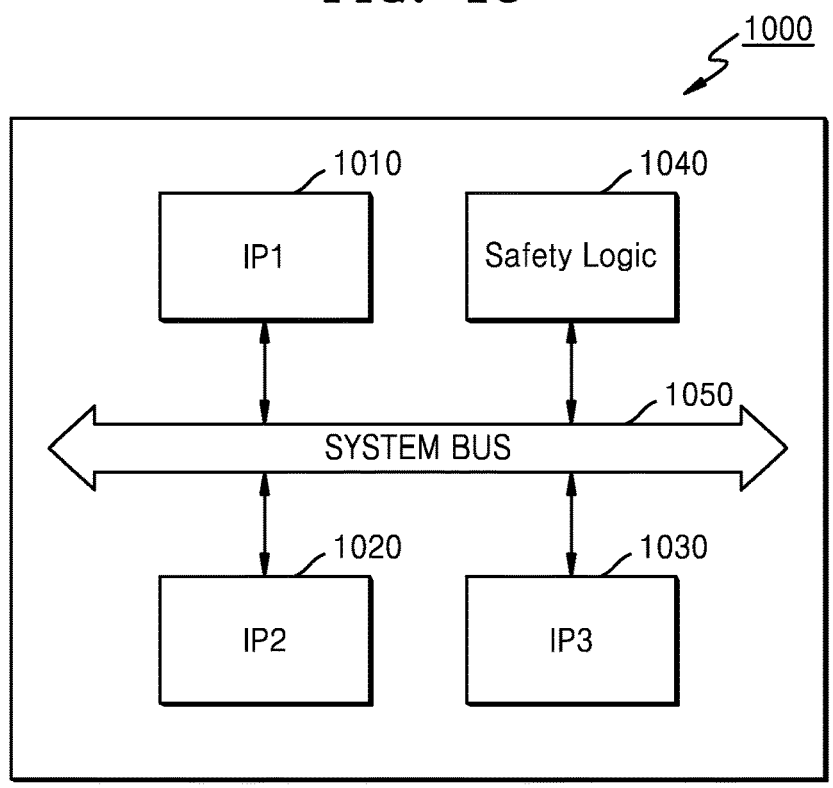
FIG. 15 is a block diagram of a System-on-Chip (SoC) including safety logic consistent with embodiments of the inventive concept.

FIG. 15 is a block diagram illustrating a System-on-Chip (SoC) 1000 incorporating a safety logic 1040 consistent with certain embodiments of the inventive concept.

Referring to FIG. 15, the SoC 1000 comprises a plurality of intellectual properties (IPs) (e.g., first to third IPs 1010, 1020, and 1030), the safety logic 1040, and a system bus 1050. The SoC 1000 may be designed to perform various functions in a semiconductor system. For example, the SoC 1000 may be an application processor.

The SoC 1000 may include various types of IPs. For example, the first to third IPs 1010, 1020, and 1030 may include a processing unit, a plurality of cores included in the processing unit, a multi-format codec (MFC), a video module (e.g., a camera interface, a joint photographic experts group (JPEC) processor, a video processor, or a mixer), a three-dimensional (3D) graphics core, an audio system, a driver, a display driver, a volatile memory, a non-volatile memory, a memory controller, an input/output (I/O) interface block, or a cache memory.

A connection scheme based on the system bus 1050 may be used as a technique for connecting the first to third IPs 1010, 1020, and 1030 to the safety logic 1040. For example, an Advanced Microcontroller Bus Architecture (AMBA) protocol from Advanced RISC Machine (ARM) may be applied as a standard bus protocol. Bus types of the AMBA protocol may include Advanced High-Performance Bus (AHB), Advanced Peripheral Bus (APB), Advanced eXtensible Interface (AXI), AXI4, AXI Coherency Extensions (ACE), and the like. Of the bus types described above, the AXI may be an interface protocol between IPs and provide a multiple outstanding address function and a data interleaving function. In addition, other types of protocols, such as uNetwork from SONICs Inc, CoreConnect from IBM, and an Open Core Protocol (OCP) from OCP-IP, may be applied to the system bus 1050.

In an example embodiment, the safety logic 1040 may detect whether there is a fault in a signal output by at least one of the first to third IPs 1010, 1020, and 1030. In an example, the second IP (or IP2) 1020 may include the same configuration as that of the first IP (or IP1) 1010 to determine whether there is a fault in the IP1 1010. Thus, the IP1 1010 may output a master signal to the safety logic 1040, and the IP2 1020 may output a comparison signal to the safety logic 1040. The safety logic 1040 may be implemented based on the embodiments described with reference to FIGS. 1 to 14. Thus, the SoC 1000 may detect whether there is a fault in signals output by the first to third IPs 1010, 1020, and 1030 during a run-time operation and detect whether gates included in the safety logic 1040 are faulty.

Figure 16:
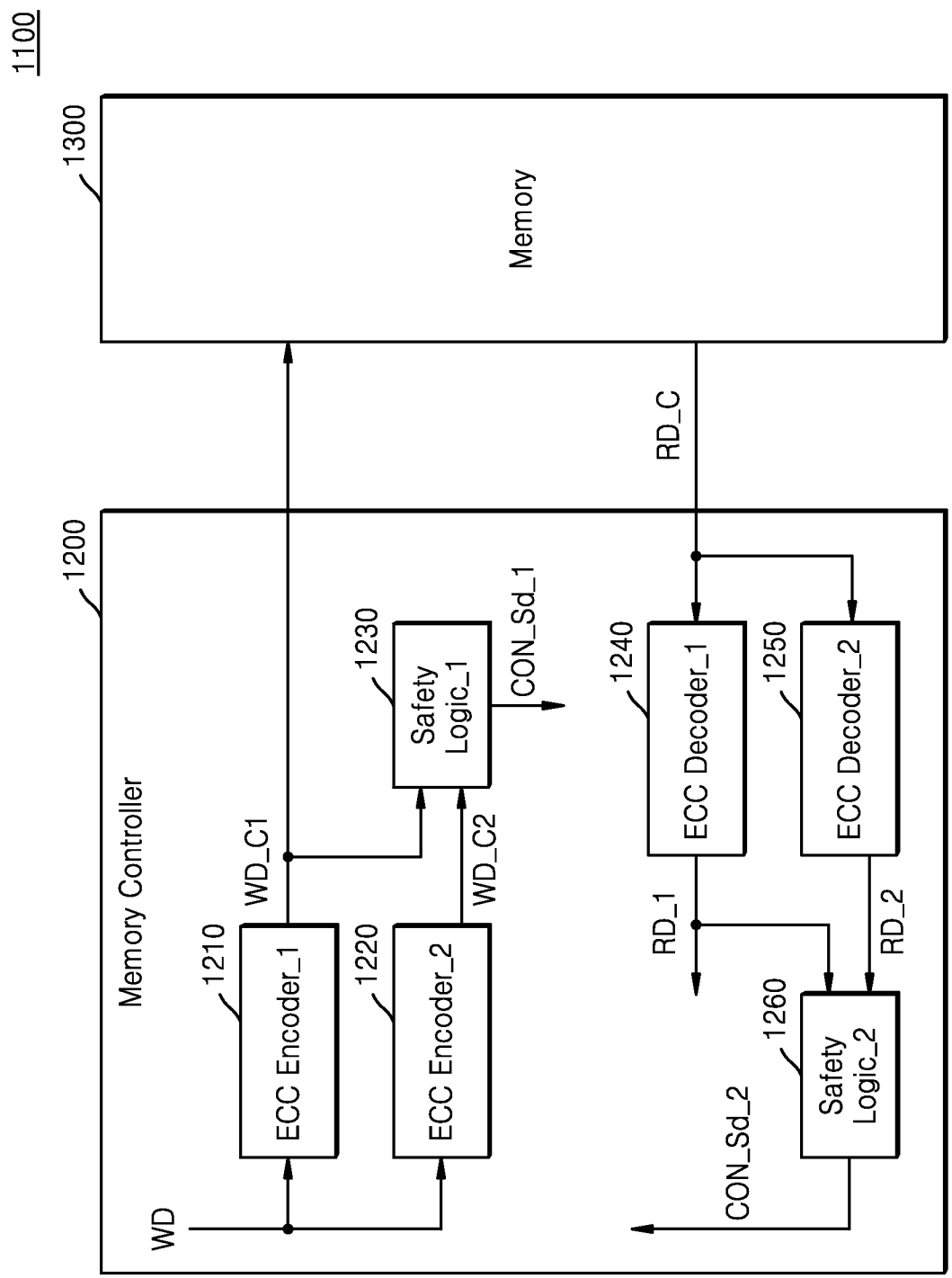
FIG. 16 is a block diagram of a memory system including safety logic consistent with embodiments of the inventive concept.

FIG. 16 is a block diagram illustrating a memory system 1100 including a safety logic consistent with certain embodiments of the inventive concept.

Referring to FIG. 16, the memory system 1100 generally comprises a memory controller 1200 and a memory device 1300, wherein the memory controller 1200 controls access (e.g., read/write) to the memory device 1300 in response to a command from a host (not shown). Specifically, the memory controller 1200 may provide an address, a command, and a control signal to the memory device 1300 and control a program operation, a read operation, and an erase operation on the memory device 1300.

The memory controller 1200 may include a first ECC encoder 1210, a second ECC encoder 1220, and a first safety logic 1230. For example, the first and second ECC encoders 1210 and 1220 may perform an ECC encoding operation based on input write data WD and output first and second encoded write data WD_C1 and WD_C2, respectively. For example, the second ECC encoder 1220 may include the same configuration as the first ECC encoder 1210 to determine whether there is a fault in a signal output by the first ECC encoder 1210.

The first safety logic 1230 may be implemented based on the embodiments described with reference to FIGS. 1 to 14. In an example embodiment, the first ECC encoder 1210 may output the first encoded write data WD_C1 as the master signal to the first safety logic 1230. Also, the second ECC encoder 1220 may output the second encoded write data WD_C2 as a comparison signal to the first safety logic 1230. The first safety logic 1230 may output a first fault search signal CON_Sd_1 as the first and second encoded write data WD_C1 and WD_C2.

The memory controller 1200 may further include a first ECC decoder 1240, a second ECC decoder 1250, and a second safety logic 1260. For example, the first and second ECC decoders 1240 and 1250 may perform an ECC decoding operation based on read data RD_C read from the memory device 1300 and output first and second decoded read data RD_1 and RD_2, respectively. For example, the second ECC decoder 1250 may include the same configuration as the first ECC decoder 1240 to determine whether there is a fault in a signal output by the first ECC decoder 1240.

The second safety logic 1260 may be implemented based on the embodiments described with reference to FIGS. 1 to 14. In an example embodiment, the first ECC decoder 1240 may output the first decoded read data RD_1 as a master signal to the second safety logic 1260. Also, the second ECC decoder 1250 may output the second decoded read data RD_2 as a comparison signal to the second safety logic 1260. The second safety logic 1260 may output a second fault search signal CON_SD_2 in response to the first and second decoded read data RD_1 and RD_2.

Figure 17:
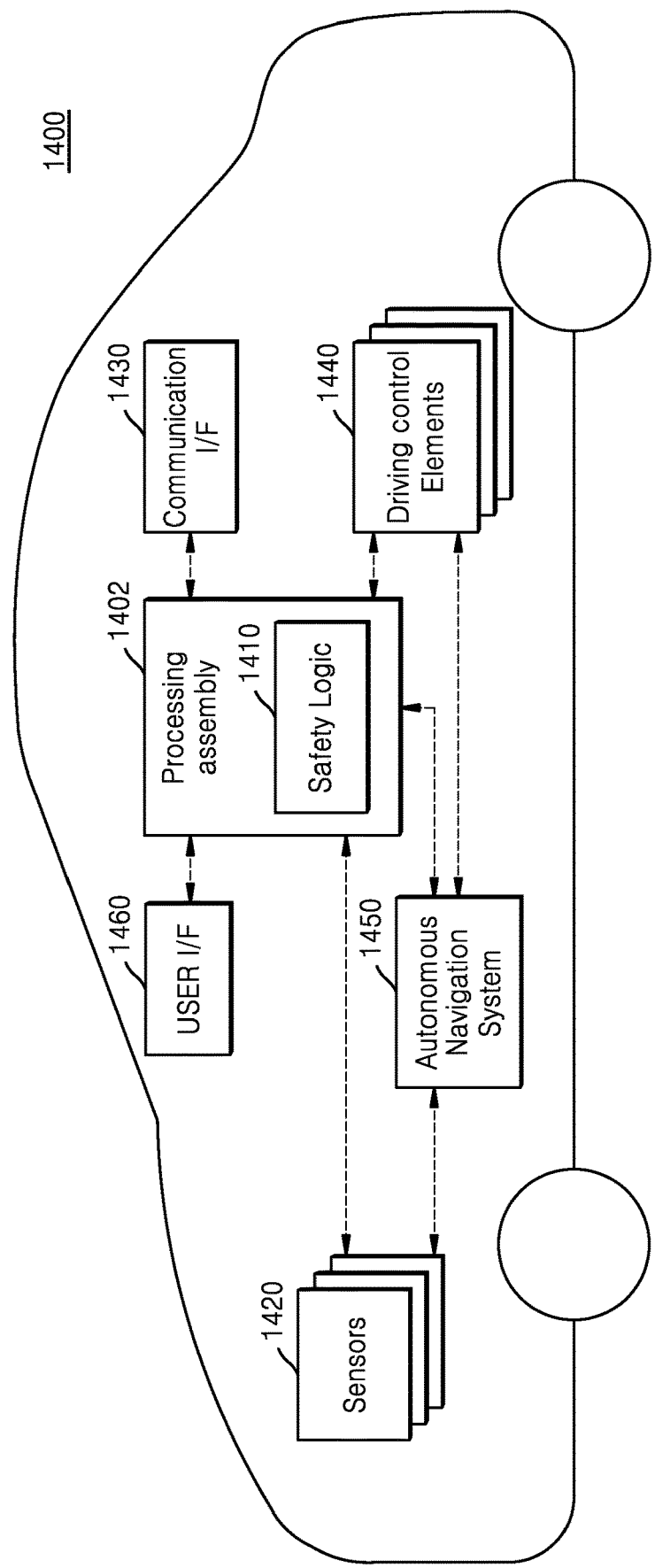
FIG. 17 is a conceptual diagram of a vehicle incorporating safety logic according to embodiments of the inventive concept.

FIG. 17 is a conceptual diagram illustrating a vehicle 1400 incorporating safety logic according to certain embodiments of the inventive concept.

Referring to FIG. 17, the vehicle 1400 comprises a processing assembly 1402, at least one sensor 1420, a communication interface 1430, a driving control element 1440, an autonomous navigation system 1450, and a user interface 1460. The sensor 1420 may include at least one camera device, an active scanning device (e.g., at least one Light Detection And Ranging (LiDAR) sensor), at least one ultrasonic sensor, and at least one geospatial positioning device. The sensor 1420 may monitor at least part of external environment surrounding the vehicle 1400 and generate a sensing signal.

The communication interface 1430 may include a transceiver and/or a global positioning system (GPS). The driving control element 1440 may include a vehicle steering device configured to control a direction of the vehicle 1400, a throttle device configured to control a motor or engine of the vehicle 1400 and control acceleration and/or deceleration, and a brake device configured to control the braking of the vehicle 1400, and an external lighting device.

The autonomous navigation system 1450 may include a computing device configured to implement autonomous control of the driving control element 1440. For example, the autonomous navigation system 1450 may include a memory configured to store a plurality of program commands and at least one processor configured to execute the program commands. The autonomous navigation system 1450 may be configured to control the driving control element 1440 based on a sensing signal output by the sensor 1420. The user interface 1460 may include a display indicating an instrument panel of the vehicle 1400.

In an example embodiment, the processing assembly 1402 may include safety logic 1410. The safety logic 1410 may be implemented based on the embodiments described with reference to FIGS. 1 to 14. Although not shown, the vehicle 1400 may further include the same configuration as each of the sensor 1420, the communication interface 1430, the driving control element 1440, the autonomous navigation system 1450, and the user interface 1460 to determine whether there is a fault in a signal output by each of the sensor 1420, the communication interface 1430, the driving control element 1440, the autonomous navigation system 1450, and the user interface 1460. Thus, the vehicle 1400 may detect whether there is a fault in a signal output by at least one of the sensor 1420, the communication interface 1430, the driving control element 1440, the autonomous navigation system 1450, and the user interface 1460 during a run-time operation (e.g., during a driving operation). Also, the vehicle 1400 may detect whether gates included in the safety logic 1410 are faulty. Thus, safety of the vehicle 1400 may be further improved.

The foregoing example embodiments of the inventive concept have been disclosed in the above with reference to the drawings. Although specific terms are employed, they are used in a generic and descriptive sense only and not for purposes of limitation. It will be understood by those of ordinary skill in the art that various changes in form and details may be made to the disclosed embodiments without departing from the spirit and scope of the inventive concept as defined by the following claims.

What is claimed is:

1. An apparatus comprising:
a first function module configured to provide a master signal;
a second function module configured to provide a comparison signal; and
safety logic comprising:
a toggle signal generator including at least one comparator configured to provide a comparison result in response to the master signal and the comparison signal, a feedback path configured to generate a first toggle signal in response to the comparison result and provide a feedback signal to the at least one comparator, and a first multiple input gate configured to generate a second toggle signal in response to the comparison result; and
a toggle signal monitor configured to provide a final fault search signal in response to the first toggle signal and the second toggle signal, and
wherein the toggle signal monitor comprises:
a first XOR gate configured to provide a first error occurrence signal in response to the first toggle signal;
a second XOR gate configured to provide a second error occurrence signal in response to the second toggle signal;
a first output gate configured to provide a first fault search signal in response to the first and second error occurrence signals;
a second output gate configured to provide a second fault search signal in response to the first and second error occurrence signals;
a second delay circuit configured to delay the first toggle signal and provide a delayed first toggle signal to the first XOR gate; and
a third delay circuit configured to delay the second toggle signal and provide a delayed second toggle signal to the second XOR gate.

2. The apparatus of claim 1, further comprising:
a clock generator configured to generate a clock signal, wherein the second and third delay circuits respectively delay the first toggle signal and the second toggle signal in response to the clock signal.

3. An apparatus including safety logic, the safety logic comprising:
a toggle signal generator configured to provide a first toggle signal and a second toggle signal in response to a master signal and a comparison signal, wherein each of the master signal and comparison signal includes a plurality of bits;
a toggle signal monitor configured to provide a final fault search signal in response to monitoring of the first toggle signal and the second toggle signals; and
wherein the toggle signal generator comprises:
a plurality of comparators configured to bit-for-bit compare the master signal with the comparison signal and generate a comparison result;
a feedback path configured to perform a first gate operation in response to the comparison result, generate the first toggle signal, and provide a feedback signal to each of the plurality of comparators in response to the first toggle signal; and
a first multiple input gate configured to perform a second gate operation in response to the comparison result and generate the second toggle signal; and
a clock generator configured to provide a clock signal, wherein the feedback path provides the feedback signal further in response to the clock signal; and
wherein the toggle signal monitor comprises:
a first XOR gate configured to provide a first error occurrence signal in response to the first toggle signal;
a second delay circuit configured to delay the first toggle signal in response to the clock signal and provide a delayed first toggle signal to the first XOR gate;
a second XOR gate configured to provide a second error occurrence signal in response to the second toggle signal;
a third delay circuit configured to delay the second toggle signal in response to the clock signal and provide a delayed second toggle signal to the second XOR gate; and
a plurality of output gates configured to provide the final fault search signal in response to the first error occurrence signal and the second error occurrence signal.

4. A method of operating an apparatus including safety logic, the method comprising:
determining, by a toggle signal generator, whether a master signal correctly correlates with a comparison signal;
generating, by the toggle signal generator, a first toggle signal and a second toggle signal in response to the determination of whether or not the master signal correctly correlates with the comparison signal; and
generating, by the toggle signal generator, a final fault search signal in response to the first toggle signal and the second toggle signal,
wherein the final fault search signal provides information indicating whether or not the master signal correctly correlates with the comparison signal, and further provides information indicating whether or not at least one of the logic gates used in the determining of whether or not the master signal correctly correlates with the comparison signal is faulty.

5. The method of claim 4, wherein the master signal includes a first plurality of bits and the comparison signal includes a second plurality of bits, and
the determining of whether or not the master signal correctly correlates with the comparison signal is made using a plurality of comparators that respectively compare one of the first plurality of bits with another one of the second plurality if bits.

6. The method of claim 5, wherein the determining of whether or not the master signal correctly correlates with the comparison signal comprises:
using a plurality of comparators to provide a comparison result to a feedback path;

using the feedback path to generate the first toggle signal
a feedback signal in response to the comparison result, wherein the feedback signal is applied to the plurality of comparators.

7. The method of claim 6, further comprising:
applying the comparison result to a first multiple input gate to generate the second toggle signal.

8. The method of claim 7, further comprising:
applying the comparison result to a second multiple input gate to generate the first toggle signal.

9. The method of claim 8, further comprising:
delaying an output of the second multiple input gate; and
inverting the delayed output of the second multiple gate to generate the feedback signal.

10. The method of claim 4, further comprising:
generating a first error occurrence signal in response to the first toggle signal;
generating a second error occurrence signal in response to the second toggle signal;
generating a first fault search signal in response to the first error occurrence signal and the second error occurrence signal; and
generating a second fault search signal in response to the first error occurrence signal and the second error occurrence signal.

11. The method of claim 10, further comprising:
delaying the first toggle signal to provide a delayed first toggle signal to a first XOR gate; and
delaying the second toggle signal to provide a delayed second toggle signal to a second XOR gate.

12. The method of claim 11, further comprising:
providing an error signal in response to a clock signal, wherein the first XOR gate provides the first error occurrence signal in response to the error signal, and the second XOR gate provides the second error occurrence signal in response to the error signal.

* * * * *